United States Patent [19]

Macaulay

[11] 4,450,062  
[45] May 22, 1984

[54] SPUTTERING APPARATUS AND METHODS

[75] Inventor: Alexander Macaulay, Cupertino, Calif.

[73] Assignee: Raytheon Company, Lexington, Mass.

[21] Appl. No.: 520,407

[22] Filed: Aug. 5, 1983

Related U.S. Application Data

[62] Division of Ser. No. 333,532, Dec. 22, 1981, Pat. No. 4,410,407.

[51] Int. Cl.$^3$ ............................................. C23C 15/00
[52] U.S. Cl. ................................. 204/298; 204/192 R; 204/192 EC
[58] Field of Search ............................. 204/298, 192 R

[56] References Cited

U.S. PATENT DOCUMENTS

3,652,444 2/1972 Lester et al. ..................... 204/298
3,933,644 1/1976 Skinner et al. .................... 204/298

*Primary Examiner*—Arthur P. Demers
*Attorney, Agent, or Firm*—Richard M. Sharkansky; Joseph D. Pannone

[57] ABSTRACT

A method of depositing material onto an object in an ionization chamber having a shutter therein which has an object-obscuring portion comprising the step of confining particles of matter deposited on the object-obscuring portion of the shutter to such object-obscuring portion while the object is being deposited with material. The object-obscuring portion of the shutter includes an open ended container, the open end thereof being formed in an upper portion of the shutter. During ionization a glow region is formed in the chamber separated from a source of the material by a dark space region. The upper surface of the shutter is disposed in the dark space region and the bottom of the container is separated from the source sufficiently to enable ionization. Prior to deposition of the material onto the object, the object-obscuring portion of the shutter is positioned between a source of the material and the object and contaminents on the surface of such source are removed therefrom and are collected within the container. After this cleaning process, the object-obscuring portion of the shutter is removed from between the source and the object to allow deposition of the material onto the object. The container confines particles of the matter collected therein during the cleaning process and prevents such particles from falling onto the object during the object deposition process.

1 Claim, 17 Drawing Figures

SPUTTERING APPARATUS AND METHODS

CROSS-REFERENCE TO RELATED APPLICATIONS

This is a division of application Ser. No. 333,532, filed Dec. 22, 1981, now U.S. Pat. No. 4,410,407.

BACKGROUND OF THE INVENTION

This invention relates generally to sputtering apparatus and methods and more particularly to sputtering apparatus and methods used in depositing material on a surface of an object.

As is known in the art, it is frequently desired to use sputtering apparatus to deposit selected materials, such as dielectric materials or conductive metals, over the surface of an object, such as a semiconductor wafer, at some stage in the processing of such object. Typically, the sputtering apparatus includes a chamber filled with a low pressure noble gas, such as argon. The material to be deposited, generally referred to as the "target," is disposed on, or adjacent to, an upper cathode electrode within the chamber, while the object is disposed on a lower pallet which serves as the anode electrode and which is also disposed within the chamber. When a suitable electrical potential is produced between the anode and cathode electrodes the argon ionize with the result that positively charged argon ions are attracted to the cathode electrode and hence such ions bombard the target. This bombardment of the target causes material to be dislodged therefrom and become deposited on the surface of the object.

In many applications it is desirable to clean the target prior to the deposition process. For example, in some applications where the object is a semiconductor wafer and where the sputtering apparatus is used to deposit a layer of a conductive material over the surface of such wafer it is sometimes desirable to clean the surface of the wafer from oxides or other contaminants prior to the deposition process. To clean the surface of the wafer the pallet holding the wafer is electrically coupled to the power supply as a cathode electrode with the target holder electrically disconnected from the power supply. The chamber's conductive walls serve as the anode electrode with the result that the argon ions are attracted to the cathode electrode, now the wafer holder, and thereby bombard the surface of the wafer, causing the contaminants thereon to be knocked out by the impinging argon ions and become deposited on the various surfaces within the chamber. In such wafer cleaning process, however, some of the contaminants become deposited on the surface of the target. In some sputtering apparatus a rotatable shutter is provided. The shutter is generally a planar-shaped apertured disk disposed within the chamber between the lower pallet and the upper target. The shutter is mechanically coupled to a servomechanism which positions the aperture therein between the target and the wafer during the deposition phase (i.e. positioning the shutter in the "open" position), but which rotates the shutter so that the aperture is moved to a different position and a nonapertured portion of the shutter is disposed between the target and the wafer (i.e. the closed position) to provide some shielding to the target against contaminants which are dislodged from the surface of the wafer during the wafer cleaning process. It is noted, however, that despite the inclusion of the shutter some target contamination may still occur with the result that cleaning of the target surface itself may be required prior to the deposition process.

In order to clean the target prior to the deposition process the power supply is switched so that the target becomes, in effect, the cathode, and the wafer pallet support the anode. The shutter remains in the "closed" position with the result that argon ions bombard the surface of the target and dislodge atoms on the contaminated surface thereof. Such dislodged atoms become deposited on the upper surface of the shutter, predominantly on the nonapertured portion of the shutter's upper surface disposed beneath the target. Having cleaned the target, the shutter is rotated to the "open" position so that the aperture is disposed between the target and the wafer. The power supply is again fed to the target holder and pallet so that the target is, in effect, the cathode, and the pallet, the anode. Therefore, argon ions bombard the target and dislodge material therefrom. Such dislodged material passes through the aperture and becomes deposited on the surface of the wafer.

While such apparatus and process have worked effectively with some target materials for other materials, such as refractory metals of titanium, tungsten and mixtures thereof, during the target cleaning process these other materials which adhere relatively well to the shutter surfaces when such surfaces are relatively clean do not adhere well to layers of material which build up on such surfaces after many target cleanings with the result that portions of such material, called "particulates," may break off from the upper surface of the shutter and fall onto the surface of the wafer during the deposition process. In order to avoid this the shutter must be cleaned periodically. Unfortunately, this cleaning requires that the apparatus be shut down, thereby causing a reduction in productivity and an increase in product cost.

As is also known in the art, some sputtering apparatus include more than one target. In such apparatus the aperture in the shutter is positioned under a selected target during the deposition process (i.e. an "open" position). The wafers are mounted on a pallet which is adapted to rotate about an axis, the targets being disposed in a circle through which the center of such axis passes. The wafers are arranged on the pallet in concentric circles, the axis passing through the center of the circles. In such apparatus atoms ejected from the selected target pass through the aperture in the shutter onto the wafers exposed by the shutter with the result that all wafers become deposited with target material as the pallet rotates through complete revolutions. In order to provide uniform deposition on the wafers the aperture must be shaped to compensate for the fact that wafers closer to the axis of rotation travel with a different velocity than wafers disposed near the outer periphery of the pallet. In some apparatus a uniformity shield (i.e., a mask having an aperture shaped to provide the desired compensation) is mounted between the target and the shutter. More particularly, the uniformity shield is mounted in fixed relationship below the target. Thus, each target has a fixed uniformity shield and such target is positioned above its associated uniformity shield. In such apparatus the uniformity shields are disposed below the so-called "dark space" region which is formed adjacent to the cathode target and hence are disposed in the plasma or glow region of the chamber with the result that target atoms dislodged therefrom during the deposition process become deposited on upper surfaces of the shields. Here again, for some materials, such as titanium, tungsten and mixtures thereof, adhesion to the upper surfaces of the shields is initially relatively good. However, as layers of such material build up on such surfaces of the shields the adhesion forces are reduced with the result that pieces of the material deposited on the shields' surfaces break off and fall onto the surface of the lower wafers. Thus, with such multiple target apparatus, in addition to the depositions which occur on the shutter during the target cleaning process, depositions occur on the surfaces of the uniformity shields during the actual wafer deposition process. It follows, then, that these shields are an additional source of contamination in the processing, thereby requiring still more frequent cleaning of the apparatus and resulting in loss of use of the apparatus, reduced productivity and increased product cost.

SUMMARY OF THE INVENTION

In accordance with the present invention sputtering apparatus and methods are provided wherein a positionable shutter, a target of coating material and an object to be coated with such material are disposed within an ionization chamber. The shutter is disposed between the target and the object and has an obscuring portion and an apertured portion. A container is formed in the obscuring portion of the shutter. The container has an open end and an opposing bottom with side walls therebetween. The open end of the container is formed in an upper portion of the shutter and is disposed adjacent the target during an initial target cleaning step wherein oxides and other contaminants on the target are removed therefrom and are deposited on the bottom and inner sidewall portions of the container. During the subsequent object coating, or deposition step, the shutter is repositioned so that the target is disposed adjacent the apertured portion of the shutter and coating material dislodged by bombarding ions passes from the target, through the aperture in the shutter, onto the objects. During both the target cleaning step and the deposition step when a gas in the chamber is ionized a glow region is formed, with a dark space region being formed adjacent the target. The upper surface of the shutter is disposed in the dark space region, while the bottom and side wall portions of the container are disposed in the glow region. In this way, during the initial target cleaning step, atoms dislodged from the contaminated target surface become collected within the container and deposition of such dislodged atoms is prevented on the upper surface of the shutter since such upper surface is disposed in the dark space region. During the subsequent object deposition step, when the aperture is disposed between the target and the object, sufficient space is established between the target and the object so that an ionization, or glow region, is produced within the chamber and the desired object deposition is produced. However, particulates produced by flaking or breaking away of material deposited on the shutter during the target cleaning phase are confined within the open-ended container and are thus prevented from falling on the surface of the object being coated. Consequently, because such particulates are confined in regions of the chamber displaced from the object during the deposition step, the intervals required between cleaning the apparatus are substantially increased, thereby allowing increased use of the apparatus, improving productivity and reducing product cost.

In accordance with an additional feature of the invention, sputtering apparatus and methods are provided wherein a shutter, a plurality of targets, each having a different coating material, and a plurality of objects to be coated with such material are disposed in an ionization chamber. The objects are disposed on a rotatable pallet. The shutter has a plurality of open-ended containers formed in an obscuring portion thereof and a uniformity-shaping apertured portion. Each one of the plurality of targets has associated with it one of the plurality of containers. The open ends of the containers are formed in an upper portion of the shutter. Each container has a bottom portion opposite the open end with side walls therebetween. Each open end is disposed adjacent its associated target during the initial target cleaning step. During the subsequent object coating step the shutter is repositioned so that the uniformity-shaping apertured portion is disposed adjacent a selected one of the targets. During both the target cleaning step and the object deposition step, when a gas in the chamber is ionized a glow region is formed, with a dark space region being formed adjacent the selected target. The upper surface of the shutter is disposed in the dark space region, while the bottom and side wall portions of the containers are disposed outside of the dark space region. In this way, during the initial target cleaning step atoms of the contaiminated surfaces of the targets are dislodged therefrom and become collected within their associated containers, while deposition is prevented on the upper surface of the shutter since it is disposed in the dark space region. During the object deposition phase, since the uniformity shaped aperture is disposed between the selected target and the portion of the objects exposed by the uniformity-shaping apertured portion, sufficient space is provided between such selected target and the object to enable establishment of an ionization or glow region therebetween with the result that dislodged target material from such selected target is substantially confined to the portion of the objects exposed by the aperture, all objects being deposited with material after complete revolution of the pallet. Further, particulates produced by flaking or breaking away of material deposited on the shutter during the target cleaning step are confined within the containers and are thus prevented from falling onto the surface of the object. Still further, by configuring the aperture as a uniformity shield to compensate for the different velocities of the objects on the rotating pallet and thereby provide substantially uniform depositions on such objects as they rotate past the aperture and by forming such configured aperture in the upper surface of the shutter which is disposed in the dark space region, material dislodged from the target during the object deposition step will not become deposited on such uniformity shield, thereby removing from the chamber a source of particulate contamination, increasing the intervals between apparatus cleaning, improving productivity and reducing product cost.

BRIEF DESCRIPTION OF THE DRAWINGS

For a more complete understanding of the concepts of this invention, reference is now made to the following description taken together in conjunction with the accompanying drawings, in which.

DESCRIPTION OF THE PREFERRED EMBODIMENTS

Figure 1:
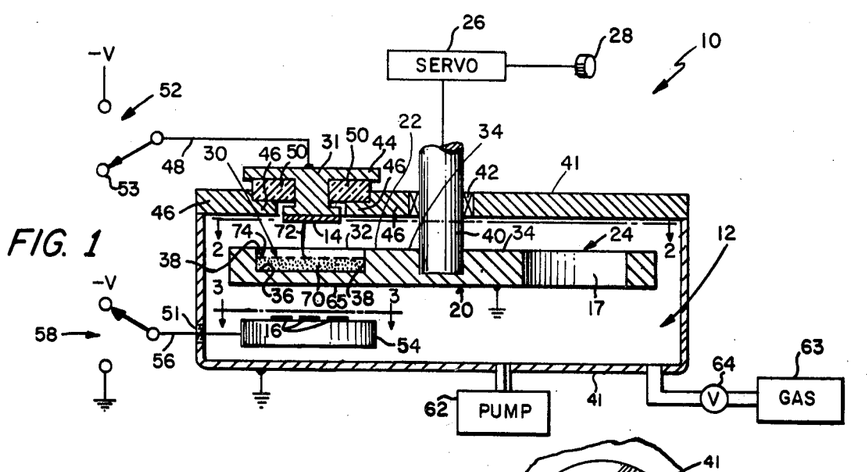
FIG. 1 is a cross-sectional, schematic view of a single target sputtering apparatus which embodies the invention with a shutter thereof in the "closed" or target cleaning position.
Figure 2:
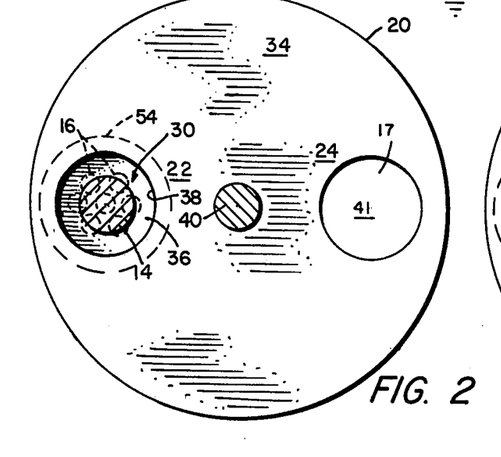
FIG. 2 is a horizontal plan view taken along line 2—2 of FIG. 1 showing the relationship between objects to be coated in the sputtering apparatus, the "closed" or target cleaning positioned shutter, and the target.
Figures 3, 4:
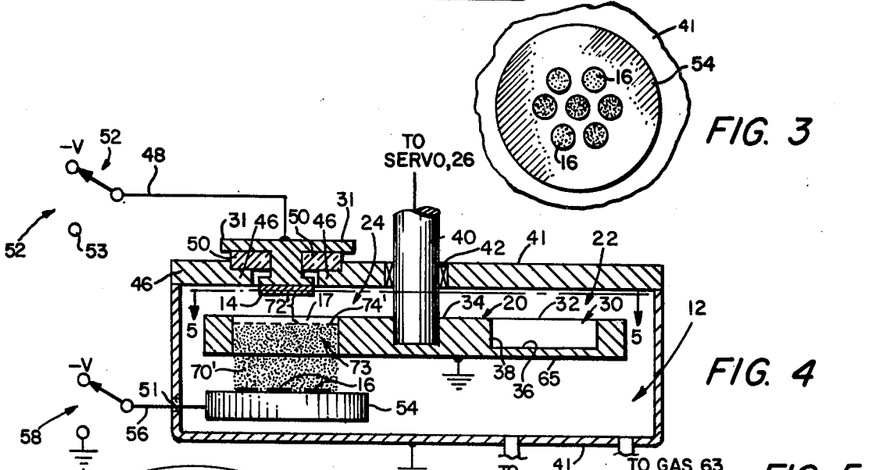
FIG. 3 is a horizontal plan view taken along line 3—3 of FIG. 1 showing the objects to be coated in the apparatus of FIG. 1.
FIG. 4 is a cross-sectional, schematic view of the single target sputtering apparatus of FIG. 1 with the shutter in the "open" or object deposition position.
Figure 5:
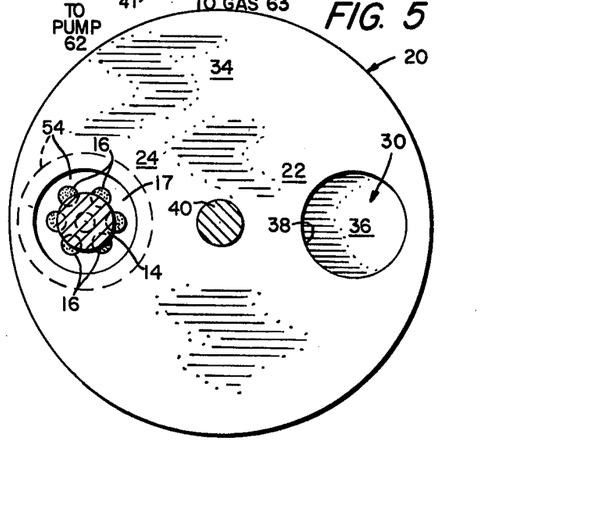
FIG. 5 is a horizontal plan view taken along line 5—5 of FIG. 4 showing the relationship between the objects to be coated in the sputtering apparatus, the "open" or object deposition positioned shutter, and the target.

Referring now to FIGS. 1 through 5, sputtering apparatus 10 is shown to include an ionization chamber 12 having disposed therein a source or target 14 of a material to be deposited, objects 16, here a plurality of semiconductor wafers, upon which such material is to be deposited, and a rotatable shutter 20 disposed between the target 14 and the wafers 16. The shutter 20 has an object obscuring portion 22 and an apertured portion 24, such shutter 20 being positionable in either a "closed" position with the object obscuring portion 22 interposed between the target 14 and the wafers 16, as shown in FIGS. 1 and 2, or in an "open" position with an aperture 17 formed in the apertured portion 24 being interposed between the target 14 and the wafers 16, as shown in FIGS. 4 and 5, selectively in accordance with commands provided to a conventional servomechanism 26 by an operator through positioning knob 28. The object obscuring portion 22 includes an open ended container 30 having its open end 32 formed in the upper surface 34 of the shutter 20, an opposing bottom portion 36, and side wall portions 38 therebetween, as indicated. The shutter 20 is here made of aluminum and is mounted to a shaft 40 which rotates through bearings 42 in the conductive walls 41 of the ionization chamber 12.

The target 14 is affixed to an electrically conductive target support 31 in any conventional manner. Here target 14 is a refractory metal, here a mixture of titanium and tungsten and is soldered to the target support 31, here a metal support. The target 14 has disposed around it a portion 46 of the conductive walls of chamber 12, such portion 46 providing a conventional annular dark space shield as indicated. The target support 31 and hence the target 14 are electrically connected to an electrical wire 48. It is noted that the target support 46 and hence the target 14 are electrically insulated here walls of chamber 12 by a dielectric separator 50, as indicated. An electrical switch 52 is connected to the wire 48. Switch 52 is manually positionable by the operator to either a $-V$ voltage source or an open circuit terminal 53.

The objects, or wafers 16, are disposed on a conductive support 54, as shown also in FIG. 3. The support 54 is connected to a conductive wire 56 (FIG. 1) which passes through the walls of chamber 12 but which is insulated from such walls by a feedthrough 51, as shown. An electrical switch 58 is connected to wire 56. Switch 58 is manually positionable by the operator to either a $-V$ voltage source or ground, as indicated. The conductive walls 41 of chamber 12 and the shutter 20 are also connected to ground, as indicated.

In operation, after the target 14 and wafers 16 are placed in the chamber 12, the shutter 20 is placed by the operator in the "closed" position with the object obscuring portion 22 interposed between the target 14 and the wafers 16, as indicated in FIGS. 1 and 2. A vacuum or exhaust pump 62 is used to exhaust gases from the enclosed ionization chamber 12. A supply 63 of a suitable gas, here a noble gas, argon, is coupled into the chamber 12 through a valve 64. More specifically, the ionization chamber 12 is evacuated to a vacuum of here about $5 \times 10^{-7}$ Torr by the vacuum pump 62 and then such chamber is back filled with argon from supply 63 to a pressure of here approximately $2 \times 10^{-3}$ Torr by valve 64. Switches 52 and 58 are actuated by the operator to couple the $-V$ volt supply to the wafer support 54 while the $-V$ supply is decoupled from the target 14, i.e. the target is in open circuit condition. In such condition the conductive walls of the chamber 12 provide an anode electrode, the wafer support 54 provides a cathode electrode and the argon gas is ionized so that the positive charged argon ions bombard the surfaces of the wafers 16 cleaning such surfaces of contaminants, such contaminants being deposited primarily on the adjacent outer surfaces 65 of the bottom portion 36 of container 30; however, some contaminants may become deposited on the surface of the target 14. It is noted that any of these contaminants are typically semiconductor material, dielectric material on the wafers, or oxides of the target material.

Having cleaned the surfaces of the wafers 16 and undesirably, however, contaminated the surface of target 14, the operator actuates switches 52 and 58, with the shutter 20 remaining in the "closed" position shown in FIGS. 1 and 2, to couple the target 14 to the −V supply and the wafer support 54 to ground. In such condition the target 12 becomes the cathode electrode and the support 54 the anode electrode. It is noted that the distance between the bottom portion 36 of the container 30 and the target 14 is sufficient to enable establishment of ionization of the argon gas and a normal glow region 70 is formed in the chamber 12. It is noted that the glow region 70 is separated from the surface of the target 14 by a Crooke dark space region 72, the boundary between the glow region 70 and the dark space region 72 being indicated by the dotted line 74. It is noted that the upper surface 34 of shutter 20 is disposed outside of the glow region 70 (i.e. in the dark space region 72). Under these conditions, positively charged argon ions bombard the surface of target 14 and dislodge atoms of such target. These dislodged atoms, now including the contaminated surface of the target 14, become deposited on the portions of the shutter 20 which are disposed in the glow region 70, here on lower portions of the inner side walls 38 and the inner bottom portion 36 of container 30. It is noted that such dislodged atoms are not deposited on the upper surface 34 of shutter 20 because such upper surface 34 is outside of the glow region 70 and in effect, the upper surface of the shutter 20 becomes electrically part of the dark space shield formed by portions 46 of the walls of chamber 12 so that electrons do not achieve the necessary momentum to cause argon ionization in this dark space 72.

After the surface of the target 14 is cleaned in the manner described above, the operator repositions shutter 20 via knob 28 into the "open" position, i.e., with the apertured portion 24 interposed between the target 14 and the wafers 16 as shown in FIGS. 4 and 5. Again the target 14 is connected to the −V supply but the wafer support 54 is grounded so that the target 14 again provides the cathode electrode. Ionization of the argon is produced and a glow region 70' is formed between the target 14 and the wafer support 54; here such glow region 70' extends through the aperture 17 in apertured portion 24 of the shutter 20 and a dark space region 72' is developed adjacent the target 14, as indicated, the interface between the glow region 70' and the dark space region 72' being indicated again by dotted line 74'. Now positively charged argon ions bombard the previously cleaned surface of the target 14 to dislodge atoms of the cleaned target material. The dislodged atoms now pass through the aperture 17 in the apertured portion 24 of shutter 20 and become deposited on the surfaces of the wafers 16. It is noted that during this deposition, particulates which might flake or break away from the material collected within the container 30 during the target cleaning step are confined within such container 30 by the side walls 38 and hence are confined to a region within chamber 12 displaced from the wafers 16. It follows then that such particulates are prevented from falling onto the surfaces of the wafers 16 when such wafers 16 are being deposited with target material. In this way the time intervals required between successive cleaning of the apparatus are increased.

Figure 6:
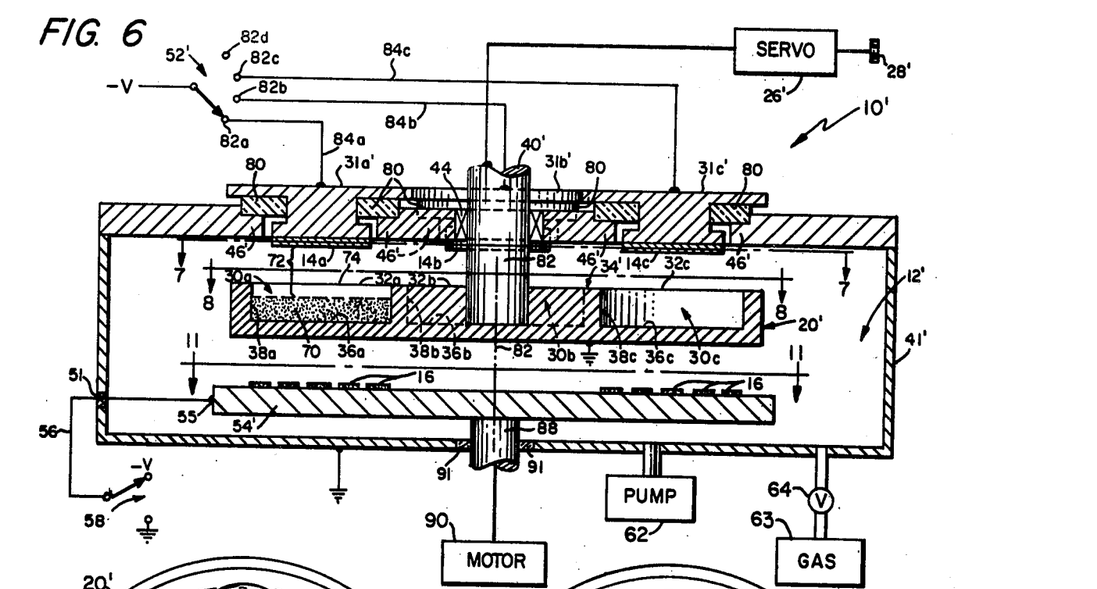
FIG. 6 is a cross-sectional, schematic view of a multiple target sputtering apparatus which embodies the invention with a shutter thereof disposed in the "closed" or target cleaning position.
Figures 7, 8, 11:
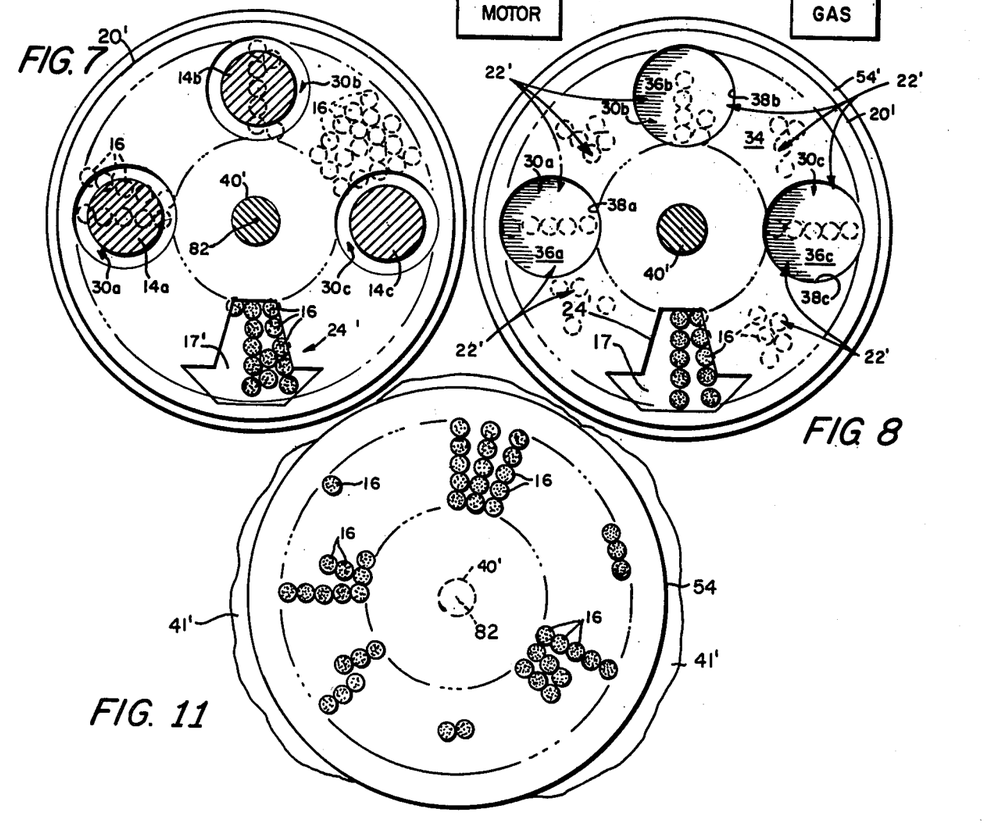
FIG. 7 is a horizontal plan view taken along line 7—7 of FIG. 6 showing the relationship between objects to be coated in the multiple target sputtering apparatus, the "closed" positioned shutter, and the targets.
FIG. 8 is a horizontal plan view taken along line 8—8 of FIG. 6 showing the relationship between the shutter of the apparatus of FIG. 7 and the objects to be coated therein.
FIG. 11 is a horizontal plan view taken along line 11—11 of FIG. 6 showing the objects to be coated in the multiple target sputtering apparatus of FIG. 6.

Referring now to FIGS. 6 through 11 a multi-target sputtering apparatus 10' is shown. Here such apparatus 10' includes three targets, 14a, 14b, 14c are fixed within the ionization chamber 12' and are arranged as indicated in FIG. 7. The targets 14a, 14b, 14c are affixed to target supports 31'a, 31'b, 31'c, respectively and are electrically insulated one from another by dielectric spacers 80, as indicated. The targets 14a, 14b, 14c are disposed about a circle, the center of which passes through axis 82. Each one of the targets 14a, 14b, 14c is electrically connected to a corresponding one of the terminals 82a, 82b, 82c, respectively of a switch 52' by a corresponding one of electrical wires 84a, 84b, 84c. The wires 84a, 84b, 84c are insulated from the conductive walls 41' of chamber 12 by the dielectric spacers 80, as indicated. The arm of the switch 52' is connected to the −V volt power supply, as indicated. A fourth terminal 82d of switch 52' is in open circuit position as indicated. Each one of the targets 14a, 14b, 14c has a dark space shield disposed around its periphery by portions 46' of the walls of chamber 12' in a manner similar to that described in connection with FIGS. 1–5.

A plurality of objects, here semiconductor wafers 16, are disposed on a rotatable pallet or wafer holder 54', as indicated. The holder 54' is connected through shaft 88 to a motor 90, such shaft 88 being insulated from conductive walls 42' by an annular insulator 91 as indicated. During operation of apparatus 10' motor 90 rotates the wafer holder 54' about axis 82. Holder 54' is electrically connected to switch 58 by a conventional pick off 55 and an electrical wire 56 which passes through the walls of chamber 12' but which is electrically insulated from such walls by a conventional feedthrough 51.

Figure 9:
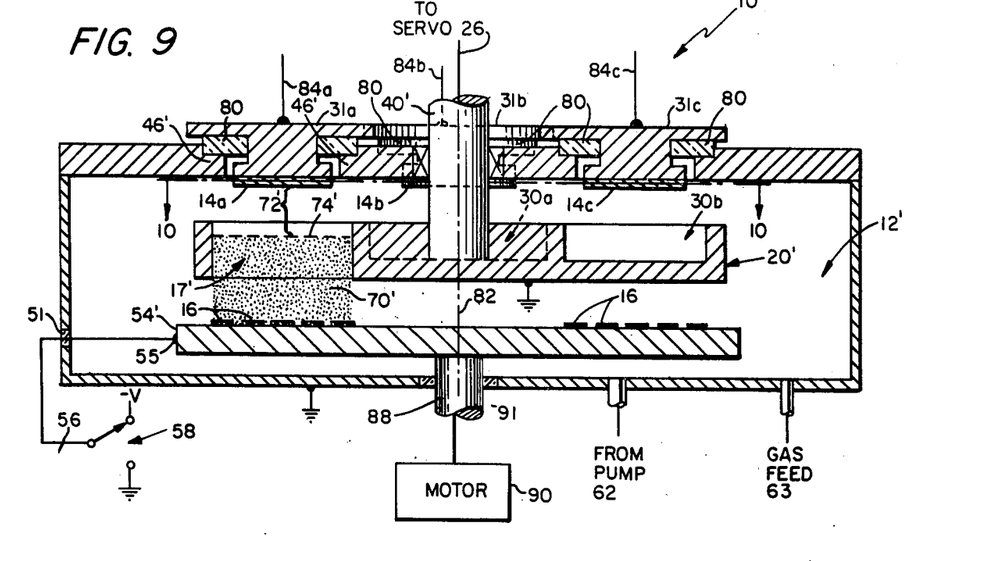
FIG. 9 is a cross-sectional schematic view of the multiple target sputtering apparatus with the shutter thereof in an "open" position to enable deposition of material of one of the targets onto the objects to be coated.
Figure 10:
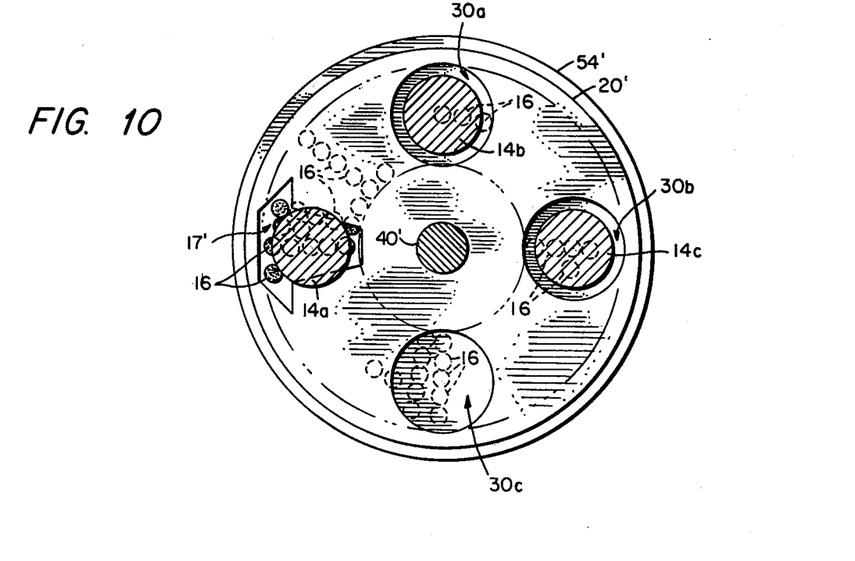
FIG. 10 is a horizontal plan view taken along line 10—10 of FIG. 9 showing the relationship between the objects to be coated in the multiple target sputtering apparatus, the "open" positioned shutter, and the targets.

A shutter 20' is disposed within chamber 12' between the targets 14a, 14b, 14c and the wafer holder 54', as indicated. The shutter 20' includes an object obscuring portion 22' and an apertured portion 24' (FIG. 8). The object obscuring portion 22' includes a plurality of, here three, open-ended containers 30a, 30b, 30c, as indicated. The containers 30a, 30b, 30c have three open ends 32a, 32b, 32c, respectively, formed in the upper surface 34' of the shutter 20', and opposing bottom portions 36a, 36b, 36c, respectively. Sidewall portions 38a, 38b, 38c are disposed between the upper surface 34' and the bottom portions 36a, 36b, 36c, respectively, as indicated. The shutter 20' is connected to a shaft 40' which passes, via bearings 44, through the walls 41' of the chamber 12' to the operator controlled servomechanism 26', as indicated. The shaft 40' rotates the shutter 20' about axis 82 to one of three target positions or to a clean or "closed" position by knob 28'. When the operator places the shutter 20' in the clean or "closed" position each of the containers 30a, 30b, 30c becomes positioned under a corresponding one of the targets 14a, 14b, 14c, respectively, as indicated in FIGS. 6 and 7, thereby obscuring the wafers 16 from such targets 14a, 14b, 14c. It is noted that when shutter 20' is positioned in the "closed" position the aperture 17' in apertured portion 24' is disposed under a region of the upper portion of chamber 12' which does not have a target mounted thereto. When the operator selects a particular one of the targets 14a, 14b, 14c through knob 28', the shaft 40' rotates the shutter 20' and repositions such shutter so that the aperture 17' becomes disposed under the selected one of the targets 14a, 14b, 14c. For example, if target 14a is selected shutter 20' rotates so that the aperture 17' is positioned under target 14a, container 30a is positioned under target 14b, container 30b is positioned under target 14c and container 30c is positioned under a region of the upper portion of chamber 12 which does not have a target mounted thereto, as indicated in FIGS. 9 and 10.

Considering now the operation of sputtering apparatus 10', after the chamber 12' is evacuated by vacuum pump 62 argon is used to backfill the chamber as described above for the single target apparatus 10. Here, however, when the argon gas is introduced in the chamber 12', motor 90 is actuated and the wafer holder 54' rotates at a constant, angular rate about axis 82. The operator positions the shutter 20' to the "closed" position as shown in FIGS. 6 and 7, the wafer holder 54' is coupled to the V supply via switch 58 and switch 52' is placed in the open circuit position (i.e. to terminal 82d). In such condition the surfaces of the wafers 16 are cleaned as described above for the single target apparatus 10. After the surfaces of wafers 16 are cleaned, the wafer holder 54' is coupled to ground potential via switch 58 and the targets are coupled to the −V supply via switch 54' for cleaning with the shutter 20' remaining in its "closed" position as shown in FIGS. 6 and 7. In this target cleaning or "closed" position a glow region 70 is formed under the selected one of the targets 14a, 14b, 14c since the bottom of the container under such selected target is separated from the target a sufficient distance to enable such glow region to be established. Thus, in FIG. 6 glow region 70 is shown below target 14a (i.e., here the selected target) since the bottom portion 36a of container 30a is sufficiently spaced from target 14a to enable establishment of the glow region 70. Again a dark space region 72 is formed adjacent the selected target. The interface between the glow region 70 and the dark space region 72 is indicated by the dotted line 74. As noted the upper surface 34' of the shutter 20' is disposed outside of the glow region 70 (i.e., in the dark space region 72), while lower portions of the sidewall 38a and the inner bottom wall portion 36a of the container 30a are disposed in the glow region 70. It follows then that the surface of the selected target, here target 14a, is bombarded by positively charged argon ions and target material is dislodged therefrom, such dislodged material being deposited within the lower portions of the container 30a. It is noted that since the upper surface 34' of the shutter 20' is not in the glow region 70 deposition of dislodged material will not substantially be deposited on the upper surface 34' of shutter 20'. Any one or combinations of the targets 14a, 14b, 14c may be cleaned in this manner, with the shutter 20' remaining in the "closed" position as shown in FIGS. 6 and 7, but with the switch 52' being positioned to the proper one of the contacts 82a-82c.

After each of the targets 14a, 14b, 14c is cleaned in the manner just described the operator operates knob 28' to position the aperture 17' of shutter 20' under a selected target and the −V supply is coupled to such selected target via switch 52'. For example, if target 14a is selected the shutter 20' is positioned as shown in FIGS. 9 and 10. In such condition a glow region 70' is formed between the selected target, here target 14a, and a portion of the wafers 16 exposed by the aperture 17'. It is again noted that a dark space region 72' is again formed adjacent the selected target 14a, the interface again being indicated by dotted line 74'. It follows then that positively charged argon ions bombard the surface of target 14a and dislodged target material therefrom which passes through the aperture 17' of shutter 20' onto surfaces of exposed ones of the wafers 16 so that the surfaces of all the wafers 16 become deposited with dislodged material as the wafer holder 54' rotates through complete revolutions. It is noted that since the upper surface 34' of the shutter 20' is outside of the glow region 70' there is substantially no deposition on such upper surface 34'. It should also be noted that the aperture 17' is configured as a uniformity shield to compensate for the fact that wafers 16 disposed on the wafer holder 54' closer to axis 82 will travel at a higher velocity than the wafers disposed closer to the outer periphery of the holder 54'. Thus, the aperture 17' has a larger opening nearer the outer periphery of the shutter 20' than that closer to axis 82. In this way, a substantially uniform deposition will occur on all wafers 16 regardless of their position on the holder. It is noted that during the deposition process particulates of the material collected within the containers 30a-30c during the target cleaning step are retained in such containers 30a-30c during the wafer deposition step.

Figure 12:
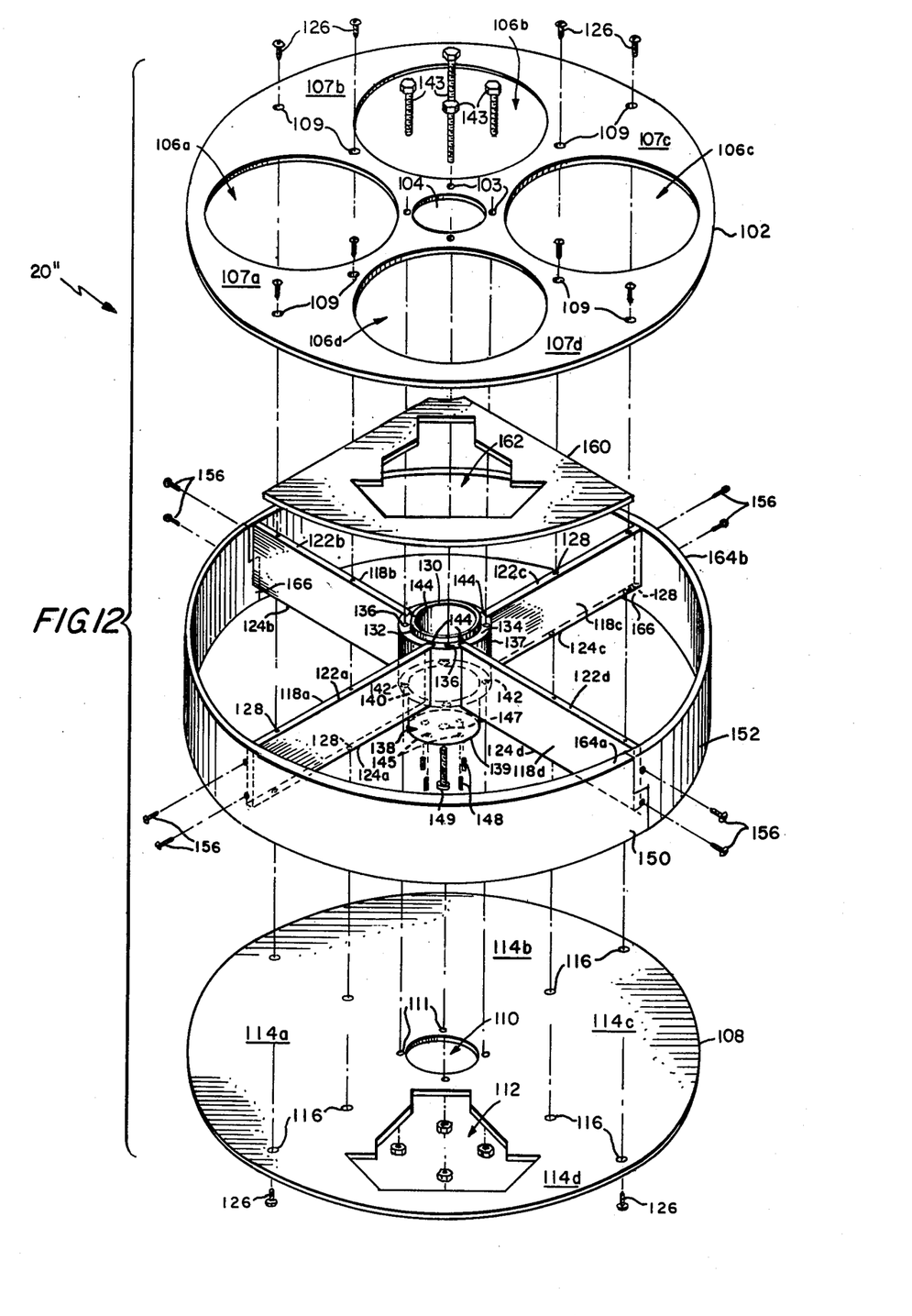
FIG. 12 is an isometric, exploded view of a shutter adapted for use in a three target sputtering apparatus according to the invention.
Figure 13:
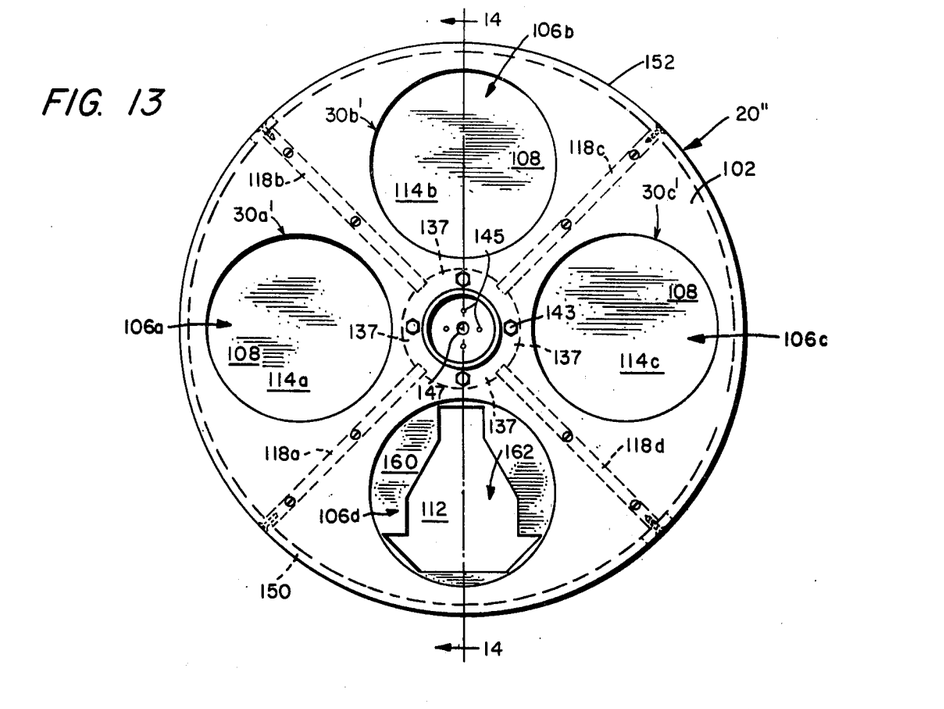
FIG. 13 is a plan view of the shutter of FIG. 12.
Figure 14:
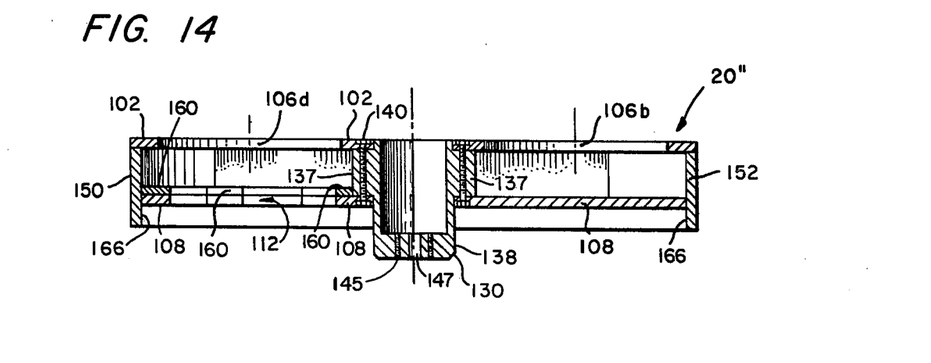
FIG. 14 is a cross-sectional view of the shutter of FIGS. 12 and 13, such cross-sectional view being taken along line 14—14 of FIG. 13.

Referring now to FIGS. 12 through 14, a shutter 20" suitable for use in a multiple target, here a three target sputtering apparatus, such as Model 4400 Production Sputtering Apparatus manufactured by Perkin-Elmer, Ultek Division, 361 Willow Street, San Jose, Cal. 95110, is shown. Shutter 20" includes: (a) an upper, circularly shaped plate 102 having a central aperture 104 with four bolt holes 103 regularly spaced about the periphery of the aperture 104, four larger circular apertures 106a, 106b, 106c, 106d having centers equal distances from the center of plate 102, such apertures 106a-106d being regularly spaced in four quadrants 107a-107d of plate 102, such quadrants 107a-107d having pairs of screw holes 109 disposed along the boundaries thereof, as shown; (b) a lower, circularly-shaped plate 108 having a central aperture 110 with bolt holes 111 regularly spaced along the inner periphery thereof and aligned with bolt holes 103 and an aperture 112 formed in one of the four quadrants 114a-114d of such bottom plate 108, here quadrant 114d, as shown, and having pairs of screw holes 116 disposed along boundaries of the quadrants 114a-114d, as shown; (c) four partitions 118a-118d having upper and lower edge portions 122a-122d and 124a-124d, respectively, as shown, attached to upper plate 102 and lower plate 108, respectively, by screws 126 passing through screw holes 109, 116 into drilled and tapped holes 128 formed in the upper and lower narrow edge portions 122a-122d and 124a-124d, as indicated; (d) a central cup-shaped post 130 having an upper neck portion 132 which passes through aperture 104, an upper shoulder 134 upon which the inner bottom portion of upper plate 102 rests, such upper shoulder having four bolt holes 136 which pass through the wider midportion 137 of cup 130 and which are aligned with bolt holes 103, a lower neck portion 138 which is longer than upper neck portion 132 so that it protrudes through the aperture 110, a lower shoulder 140 which interfaces with the upper inner surface portion of bottom plate 108, such shoulder 140 having both holes 142, which are in effect the lower ends of bolt holes 136 and which are aligned with bolt holes 111 to receive bolts 143 through holes 103, 136, 142 and 111, and four slits 144 formed about the outer periphery of the larger diameter midportion 137 to receive the narrow inner end portions of partitions 118a-118d, as shown, and a bottom portion 139 having four holes 145 drilled therethrough and central hole 147, as indicated, such holes passing into the bottom inner region of the cup-shaped port 130 to receive set screws 148 and a fastening bolt 149, as indicated; (e) a pair of semicircular outer rims 150, 152 fastened to the outer end portions of partitions 118a–118d with screws 156, as indicated; and (f) a generally triangularly or wedge-shaped uniformity shield 160 having an aperture 162 formed therein and shaped identically to, and aligned with, aperture 112, such shape being selected to provide a uniform deposition to compensate for a use with a rotary wafer support as described above in connection with aperture 73' of FIG. 8, such shield 160 being disposed on quadrant 114d on the upper surface of bottom plate 108 and being secured to shutter 20" by forces supplied by outer rim 150 as such rim 150 forces the edges of shield 160 tightly against partitions 118a and 118d and a portion of the outer midportion 137 of post 130. It is noted that the widths of rims 150, 152 are greater than the widths of partitions 118a–118d and the upper edges 164a, 164b of rims 150, 152 are flush with upper edges 122a–122d of partitions 118a–118d with the result that the lower portions of rims 150, 152 protrude below the bottom plate 108 to form a lip 166 (FIG. 14) which extends about the lower outer periphery of the shutter 20", as indicated, for reasons to be described hereinafter. When assembled, shutter 20" corresponds to the diagrammatically represented shutter 20' shown in FIGS. 6 through 10 and includes three open-ended containers 30a', 30b' and 30c' (FIG. 13) having apertures 106a–106c, respectively, formed in upper plate 102, bottom portions formed by quadrants 114a–114c of bottom plate 102 and side walls therebetween formed by partitions 118a–118d, rims 150, 152 and the midportion 137 of post 130. These containers 30a', 30b' and 30c' provide the object-obscuring portion of shutter 20". Shutter 20" has an apertured portion provided by apertures 106d, 162 and 112.

Figure 15:
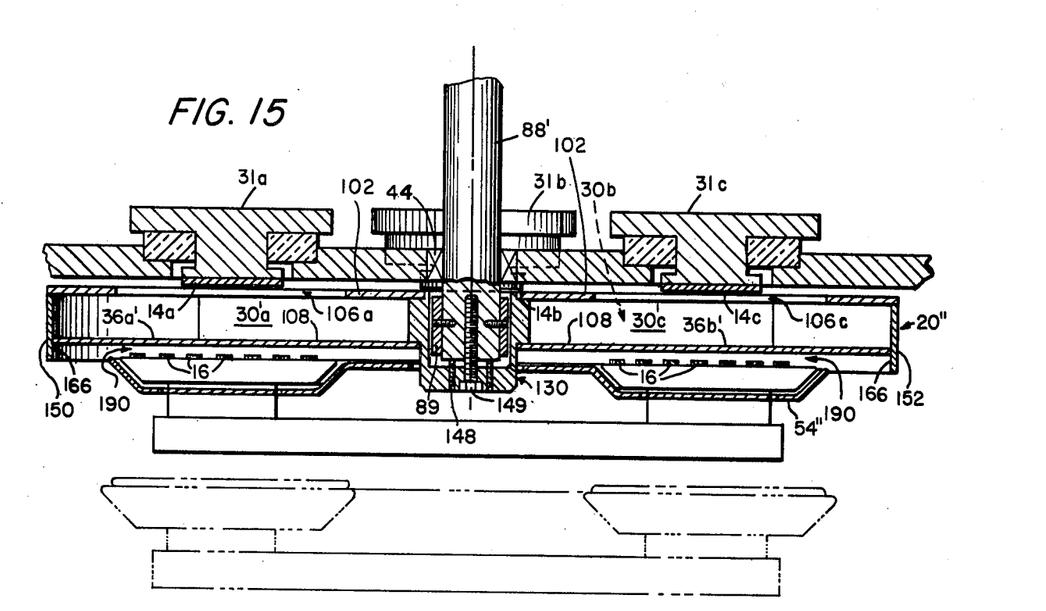
FIG. 15 is a cross-sectional view of sputtering apparatus, including the shutter of FIGS. 12-14, with such shutter in a closed position.
Figure 16:
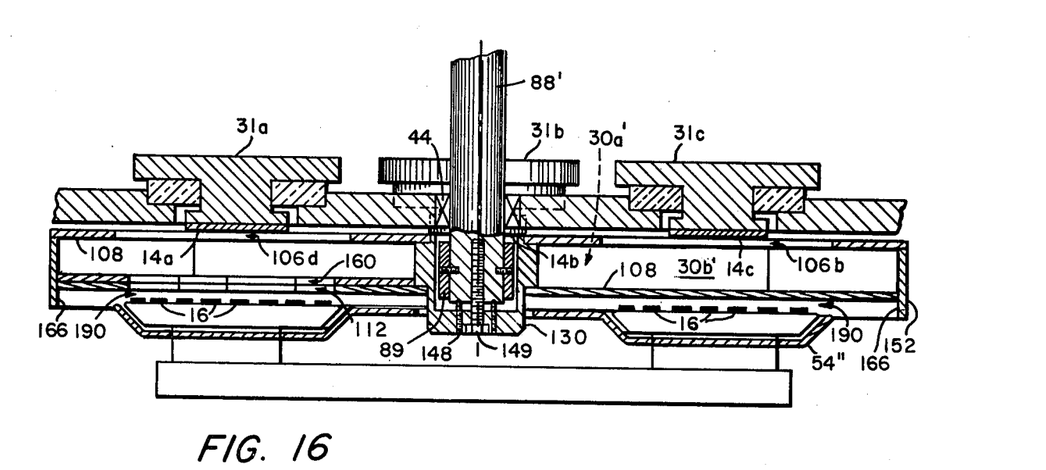
FIG. 16 is a cross-sectional view of sputtering apparatus, including the shutter of FIGS. 12-14, with such shutter in one of three open positions.

Referring now to FIGS. 15 and 16 which correspond to FIGS. 6 and 8, respectively, shutter 20" is shown disposed between targets 14a', 14b' and 14c' and a rotatable wafer support or holder 54", as indicated. FIG. 15 shows the shutter 20" in the closed portion with containers 30a', 30b' and 30c' being disposed beneath targets 14a', 14b' and 14c', respectively. FIG. 16 shows the shutter 20" in an open one of three open positions, here with the apertured portion disposed under target 14a'. It is noted that shaft 88' which may be the shaft for the shutter used in the 4400 apparatus referred to above has an outer sleeve 89 bolted to it, such shaft and sleeve being inserted into the cup-shaped post 130 and bolted to shutter 20" by fastening bolt 149. The shutter 20" is leveled by set screws 148. It is noted that the lip 166 extends about the upper portion of the wafer support 54" and thereby provides an outer lateral enclosure for a deposition region 190. Further, post 130 provides an inner lateral enclosure for deposition region 190. Thus, lip 166 and post 130 provide outer and inner side peripheral boundaries for the deposition region 190. Formation of such an "enclosed" deposition region 190 adjacent the wafer support 54" contributes to the degree of uniformity in the etching or wafer cleaning process among the wafers 16. (It is noted in FIG. 15 that wafer support 54" is shown in phantom in its lowered portion since in the 4400 apparatus the support therein is designed to be placed in either a raised or lowered position.) When used in the 4400 apparatus the distance between the surfaces of the targets 14a'–14c' and the upper surface of the bottom plate 108 is 1.75 inches, the diameters of apertures 106a–106d are 9.5 inches, and the upper surface of upper plate 102 is separated from the surfaces of targets 14a'–14c' a distance of 0.125 inches. With such configuration a glow region is produced in the apparatus during the cleaning and deposition steps with the upper plate 102 being disposed outside of such region (i.e. in the dark space region adjacent the targets 14a'–14d') and with the bottoms 36a'–36c' of containers 30a'–30c' being in the glow region as described above in connection with FIGS. 6 through 10.

Figure 17:
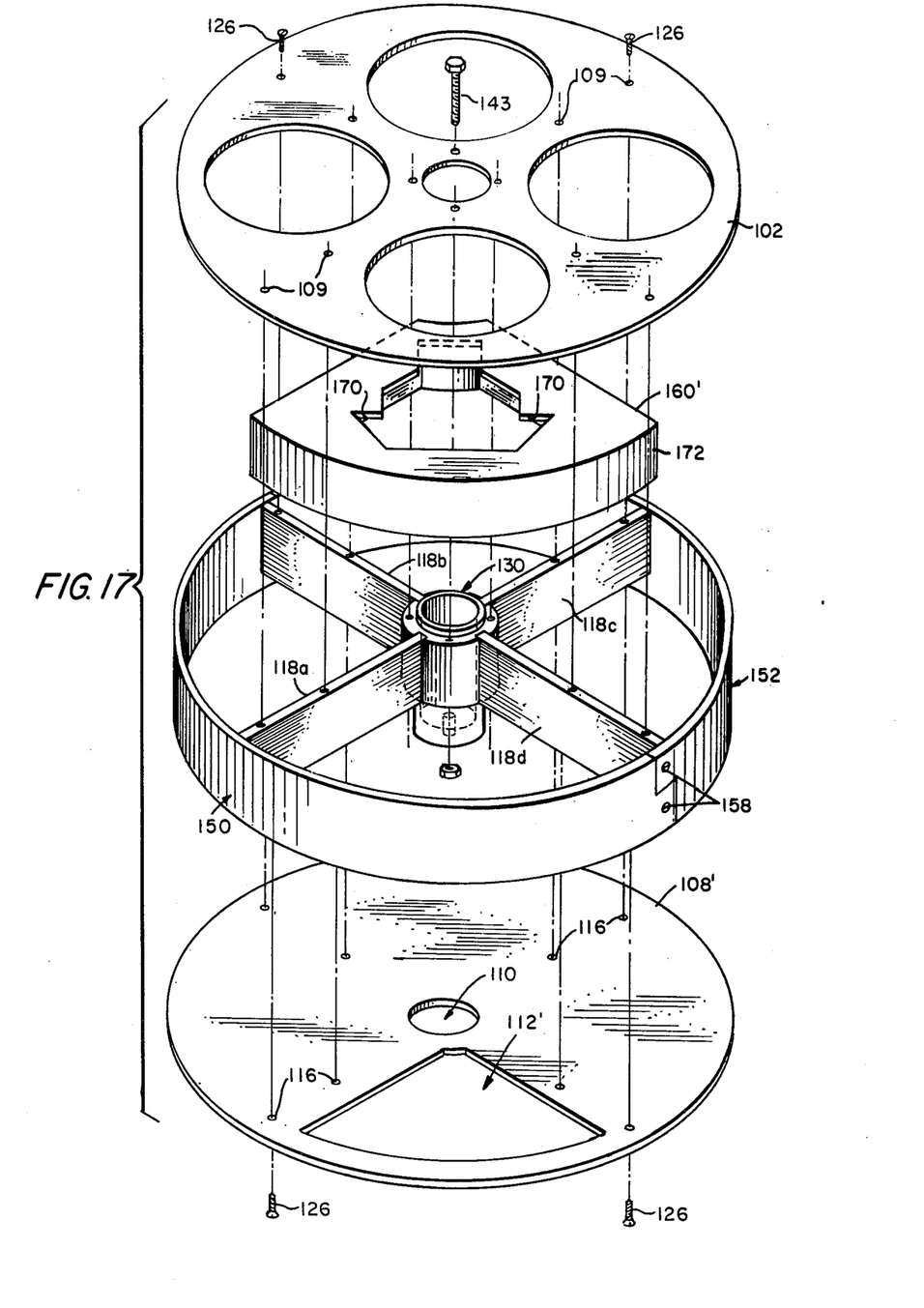
FIG. 17 is an isometric, exploded view of an alternative embodiment of a shutter adapted for use in a three target sputtering apparatus.

It is noted that during the deposition step some target material will become deposited on the upper surface of uniformity shield 160. Since such shield 160 is a separate piece, it can be easily removed by removing rim 150 and slipping such shield 160 off from the bottom plate 108. In order to prevent such deposition on the upper surface of the uniformity shield 160 during the deposition step such shield may be formed with a thickness equal to substantially, but slightly less than, the thickness of the partitions 118a–118d, as shown, for uniformity shield 160' in FIG. 17. Here the upper surface of shield 160' is substantially in the same plane as upper plate 102 and hence will be disposed in the dark space region and outside of the deposition region. It is noted that the upper plate 170 is relatively thin compared with the peripheral side walls 172 of shield 160' thereby reducing the amount of vertical surface area of shield 160' which might become deposited with material.

Having described preferred embodiments of the invention, it is now evident that other embodiments incorporating these concepts may be used. It is felt, therefore, that this invention should not be restricted to the disclosed embodiments, but rather should be limited only by the spirit and scope of the appended claims.

What is claimed is:

1. Sputtering apparatus, comprising:
   (a) means, including an ionization chamber, for producing ions in the ionization chamber;
   (b) means, disposed within the ionization chamber, for supporting a target material;
   (c) means, disposed within the chamber, for supporting an object to be deposited with particles ejected from the target material by bombardment of such target material with the ions produced within the ionization chamber; and
   (d) a shield, disposed in the ionization chamber between the target supporting means and the object supporting means, such shield having a lip disposed about the object supporting means.

* * * * *

UNITED STATES PATENT OFFICE
CERTIFICATE OF CORRECTION

Patent No. 4,450,062           Dated May 22, 1984

Inventor(s) Alexander Macaulay

It is certified that error appears in the above-identified patent and that said Letters Patent are hereby corrected as shown below:

Column 9, Line 13:   Change "V" to -- -V --.

Signed and Sealed this

Fifteenth Day of July 1986

[SEAL]

Attest:

DONALD J. QUIGG

Attesting Officer   Commissioner of Patents and Trademarks